United States Patent [19]
Jewell

[11] Patent Number: 5,617,445
[45] Date of Patent: Apr. 1, 1997

[54] QUANTUM CAVITY LIGHT EMITTING ELEMENT

[75] Inventor: Jack L. Jewell, Boulder, Colo.

[73] Assignee: Picolight Incorporated, Boulder, Colo.

[21] Appl. No.: 483,271

[22] Filed: Jun. 7, 1995

[51] Int. Cl.$^6$ .............................. H01S 3/19; H01S 3/082
[52] U.S. Cl. ............................. 372/96; 372/39; 372/50; 372/92
[58] Field of Search .......................... 372/39, 92, 96, 372/50, 99

[56] References Cited

U.S. PATENT DOCUMENTS 5,335,237  8/1994  Zapata ........................................ 372/39
5,478,658  12/1995  Dodabalapur et al. ................. 372/92 X

OTHER PUBLICATIONS

Joannopoulos, John D.; Robert D. Meade and Joshua N. Winn; *Photonic Crystals*, 1995, Chapter 5 (pp. 54–77), Chapter 7 (pp. 94–106) and Appendix c (pp. 121–126). (No Month).

Zhang et al., "Microcavity vacuum–field configuration and spontaneous–emission power," *Wednesday Morning/CLEO'95* (May 1995), pp. 169–170.

Fan et al., "Design of three–dimensional photonic crystals at submicron lengthscales," *Appl. Phys. Lett.*, vol. 65, No. 11 (Sep. 12, 1994), pp. 1466–1468.

Wendt et al., "Nanofabrication of photonic lattice structures in GaAs/AlGaAs," *J. Vac. Sci. Technol.*, vol. 11, No. 6 (Nov/Dec. 1993), pp. 2637–2640.

Yamamoto et al., "Optical Processes in Microcavities," *Physics Today* (Jun. 1993), pp. 66–73.

Baba et al., "Spontaneous Emission Factor of a Microcavity DBR Surface–Emitting Laser," *IEEE J. of Quantum Electronics*, vol. 27, No. 6 (Jun. 1991), pp. 1347–1358.

Jewell et al., "Transverse modes, waveguide dispersion and 30 ps recovery in submicron GaAs/AlAs microresonators," *Appl. Phys. Lett.*, vol. 55, No. 1 (Jul. 3, 1989), pp. 22–24.

Primary Examiner—James W. Davie
Attorney, Agent, or Firm—Jagtiani & Associates

[57] ABSTRACT

A quantum cavity light emitting element is provided, comprising first and second mirrors to form a first cavity, at least first and second reflecting surfaces to form a second cavity oriented perpendicularly to the first, and a light emitting material within both cavities. The thickness of the first cavity is designed to enhance emission of light from the light emitting material along the axis of the first cavity, while the second cavity has a predetermined thickness which suppresses emission of light from the light emitting material.

45 Claims, 6 Drawing Sheets

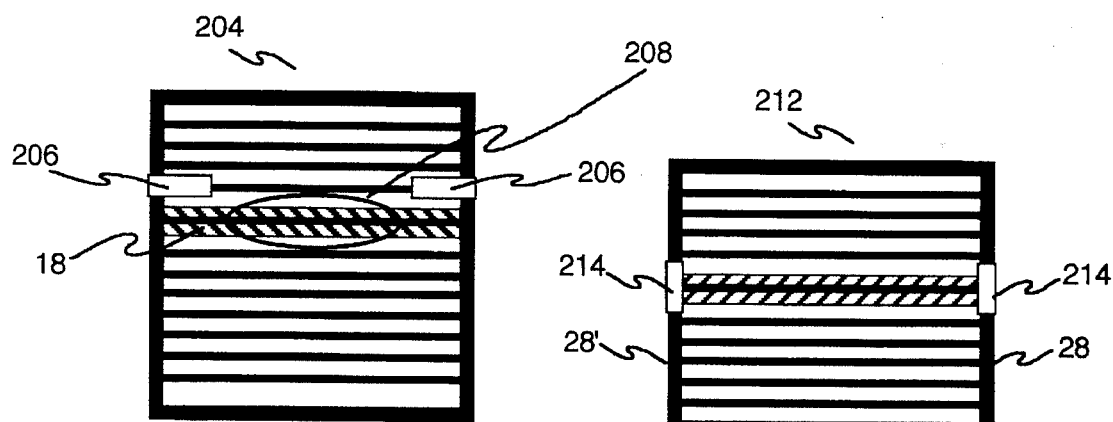
Figure 7
Figure 8
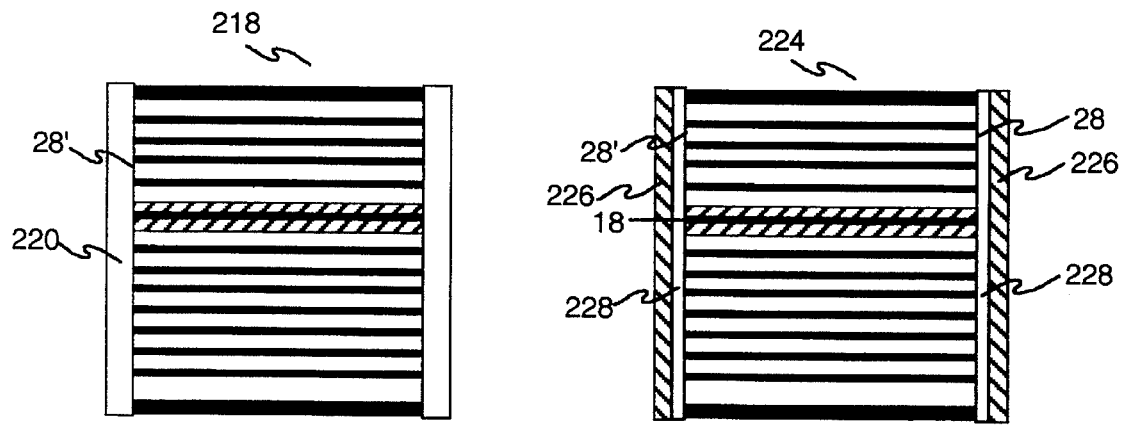
Figure 9A
Figure 9B
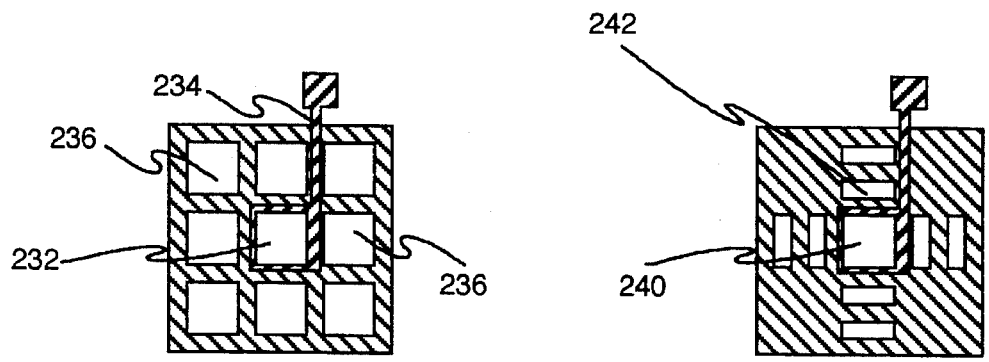
Figure 10A
Figure 10B

QUANTUM CAVITY LIGHT EMITTING ELEMENT

BACKGROUND OF THE INVENTION

1. Field of the Invention

The present invention relates to quantum cavity light emitters and, more particularly, to a quantum cavity light emitter having a predetermined shape and dimensions such that spontaneous light emission is enhanced in some directions and suppressed in other directions.

2. Description of the Prior Art

Microcavities are optical cavities having dimensions on the order of an optical wavelength. In microcavities, the spontaneous emission of light can be strongly modified. The modification of spontaneous emission is best understood as follows. Spontaneous emission is really stimulated emission. In the absence of any optical medium, the weak, randomly-oriented "vacuum fluctuation" electromagnetic fields provide the stimulation, producing light emission equally in all directions at a rate determined by the strength of the fields. These vacuum fields are present virtually everywhere unless significant effort is taken to suppress them. When the vacuum fields are incident on an optical structure, such as an optical cavity, they are modified in the same manner as any electromagnetic wave incident on the structure. When light is incident upon a planar Fabry-Perot optical cavity at the cavity resonance frequency, the optical intensity inside the cavity is much higher than the incident intensity. At different incident angles, the resonant frequencies are different. Light incident from the side of the cavity sees no cavity at all, and the light intensity is not strongly modified. Therefore in a planar Fabry-Perot cavity, spontaneous emission is strongly enhanced along the cavity axis at the normal-incidence resonant frequency. Spontaneous emission is also enhanced at a range of angles deviating from the cavity axis at higher optical frequencies (shorter wavelengths). Of critical importance to understanding modification of spontaneous emission in a cavity, is the fact that the on axis spontaneous emission is suppressed at off-resonant frequencies. At angles perpendicular to the cavity axis, the spontaneous emission is not strongly modified. However the emission occurs for all frequencies at which the material can emit. Thus the total emission perpendicular to the cavity axis, the "lateral modes," can greatly exceed the emission normal to the cavity axis, the "axial modes." In most devices, the axial modes represent the desired or useful emission, while light emitted into the lateral modes is not used and therefore considered wasted, however, in conventional light emitting devices utilizing optical cavities, most of the spontaneous emission is emitted into the lateral modes and therefore wasted.

A general discussion of microcavities is found in the article by Yamamoto and Slusher, entitled "Optical Processes in Microcavities." The article provides an introduction to cavity quantum electrodynamics, which describes the spontaneous emission processes in microcavities, and describes the three major classes of microcavities: micro-Fabry-Perot cavities, "whisper-gallery" cavities, and photonic bandgaps. Micro-Fabry-Perot cavities, typically called vertical cavities due to their similarity with vertical-cavity surface-emitting lasers (VCSELs), produce counter-propagating standing waves along the cavity axis. Vertical cavities may be planar with negligible lateral structure, or they may additionally have lateral reflectance. Vertical cavities with lateral reflectance are the structures which are improved in the present invention. Whisper-gallery cavities produce traveling waves which circulate around the typically circular cavity. Photonic bandgaps provide reflectance in essentially all directions, and their fabrication generally requires complex three-dimensional fabrication processes.

The article by Zhang et al., "Microcavity Vacuum-Field Configuration and Spontaneous Emission Power," describes theoretical and experimental analysis of spontaneous emission in vertical cavities. Although the vertical cavities have a lateral surface which provides some lateral reflectance, the lateral dimensions are so large, 15 to 20 micrometers, compared to the wavelength of the light in the material, about 0.25 micrometer, that these are essentially planar vertical cavities. The article theoretically predicts that a maximum of 11% of the light emitted goes into the axial modes. The experiments report a maximum of 8.5% emission into the axial modes.

The article by Jewell et al., entitled "Transverse Modes, Waveguide Dispersion, and 30 ps Recovery in Submicron GaAs/AlAs Microresonators," describes some effects seen in vertical microcavities with laterally defined diameters ranging from less than 0.5 micrometers to 1.5 micrometers. Transverse axial modes were reported, which were separated in wavelength by 6 nanometers for a 1.4 µm diameter device, and by 7.4 nm for a 1.2 µm diameter device. The waveguiding optical confinement also shifted the fundamental axial mode resonance to shorter wavelengths, in agreement with a numerical simulation. Waveguides with smaller diameters have larger shifts of their axial modes.

The article by Baba et al., entitled "Spontaneous Emission Factor of a Microcavity DBR Surface-Emitting Laser." theoretically describes the spontaneous emission from vertical cavities with lateral optical confinement. The lateral optical confinement is provided by etching the structures, thereby forming sidewalls. The sidewalls will necessarily reflect light incident upon them. In this article, effects due to the optical waveguiding confinement are described; however, effects arising from the lateral, or horizontal, cavities formed by the reflecting sidewalls are not considered. The article describes the fraction of light which is emitted into the fundamental axial mode, predicting it to increase monotonically with decreasing lateral dimension. To achieve a high fraction of light into the fundamental axial mode, the device must be of submicron lateral dimensions and operate at low temperature.

The article by Fan et al., entitled "Design of Three-Dimensional Photonic Crystals at Submicron Lengthscales," describes a three-dimensional photonic bandgap structure which is designed for simple fabrication. While previously described photonic bandgaps involved etching of deep holes at multiple angles, the photonic bandgap described in the article required only a single vertical etch. However, even before the deep hole etching process is performed, the material to be etched first had to be prepared through a multiple etch-deposition process, because the device relies upon a significant amount of lateral structure. This structure is therefore not considered manufacturable, nor is it a vertical microcavity.

The article by Wendt et al., entitled "Nanofabrication of Photonic Lattice Structures in GaAs/AlGaAs, describes a two-dimensional photonic bandgap structure oriented in the plane of a semiconductor wafer. The photonic bandgap was fabricated by etching circular holes in a hexagonal pattern. The three photonic bandgap designs reported all involved extremely small hole diameters, or extremely small separations between holes, or both. The largest holes were less than half the vacuum optical wavelength, or 370 nm in diameter, and the largest separations were less than ⅛ the vacuum optical wavelength, or 100 nm. Fabrication was, therefore, extremely difficult and was successful in only one of the three designed structures, which had 245 nm diameter holes and 50 nm separations. For each of the three designs, the lattice constant was about half the optical wavelength in the composite material.

SUMMARY OF THE INVENTION

It is therefore an object of the invention to provide a vertical microcavity light emitting device which suppress light emission in directions substantially perpendicular to the cavity axis.

It is another object of the invention to provide a vertical microcavity light emitting device which is manufacturable.

It is yet another object of the invention to provide a vertical microcavity light emitting device in which nonradiative recombination is reduced.

It is yet another object of the invention to provide a vertical microcavity light emitting device in which light emission in directions perpendicular to the cavity axis is further suppressed by nearby vertical microcavities.

It is yet another object of the invention to provide a light emitting device in which the only cavities are oriented perpendicular to the desired emission direction and in which the cavities suppress light emission in directions substantially perpendicular to the desired emission direction.

It is yet another object of the invention to provide a light emitting device in which a two-dimensional photonic bandgap structure with minimum feature sizes greater than ⅛ the vacuum optical wavelength is used to suppress light emission in directions substantially perpendicular to the desired emission direction.

It is yet another object of the invention to provide a light emitting device in which a two-dimensional photonic bandgap structure with a lattice constant greater than one optical wavelength in the composite material is used to suppress light emission in directions substantially perpendicular to the desired emission direction.

According to one broad aspect of the invention, there is provided a vertical microcavity with predetermined lateral dimensions (a quantum cavity light emitter, or QCLE) comprising: at least one light emitting material, the light emitting material emitting light in a wavelength range centered about a center wavelength; first and second reflecting mirrors at opposite sides of the light emitting material forming a first optical cavity in a first dimension which includes the light emitting material and reflecting mirrors and which enhances emission of light substantially parallel to the first dimension at a wavelength within the wavelength range, at least one of the mirrors being at least partially transparent to light in the wavelength range to allow light emitted from the light emitting material to be emitted therethrough; and at least two reflective surfaces oriented substantially perpendicular to the first dimension, the two reflective surfaces forming a second optical cavity in a second dimension substantially perpendicular to the first dimension, the second optical cavity being of a predetermined size such that it suppresses emission of light substantially parallel to the second dimension at a wavelength within the wavelength range. It is within the scope of the invention that either or both of the first and second reflecting mirrors have negligible reflectivity.

According to another broad aspect of the invention, multiple QCLEs are arranged with predetermined separations in order to further suppress emission of light substantially parallel to the second dimension.

According to another broad aspect of the invention multiple QCLEs are arranged as a two-dimensional photonic bandgap structure with minimum feature sizes greater than ⅛ the vacuum optical wavelength, or with a lattice constant equal to or greater than one wavelength in the composite medium.

Other objects and features of the present invention will be apparent from the following detailed description of the preferred embodiment.

BRIEF DESCRIPTION OF THE DRAWINGS

The invention will be further described in conjunction with the accompanying drawings, in which:

FIG. 7 is a cross-sectional side view illustrating confinement of electrical current;

FIG. 8 is a cross-sectional side view illustrating passivation of the lateral boundaries of the light emitting material;

FIG. 9A is a cross-sectional side view of a QCLE in which lateral boundaries are a dielectric material;

FIG. 9B is a cross-sectional side view of a QCLE in which lateral boundaries are an insulated metallic material;

FIG. 10A is a top planar view of an activated QCLE surrounded by non-activated QCLEs;

FIG. 10B is a top planar view of an activated QCLE surrounded by non-activated reflecting elements.

DETAILED DESCRIPTION OF THE PREFERRED EMBODIMENT

Figure 1A:
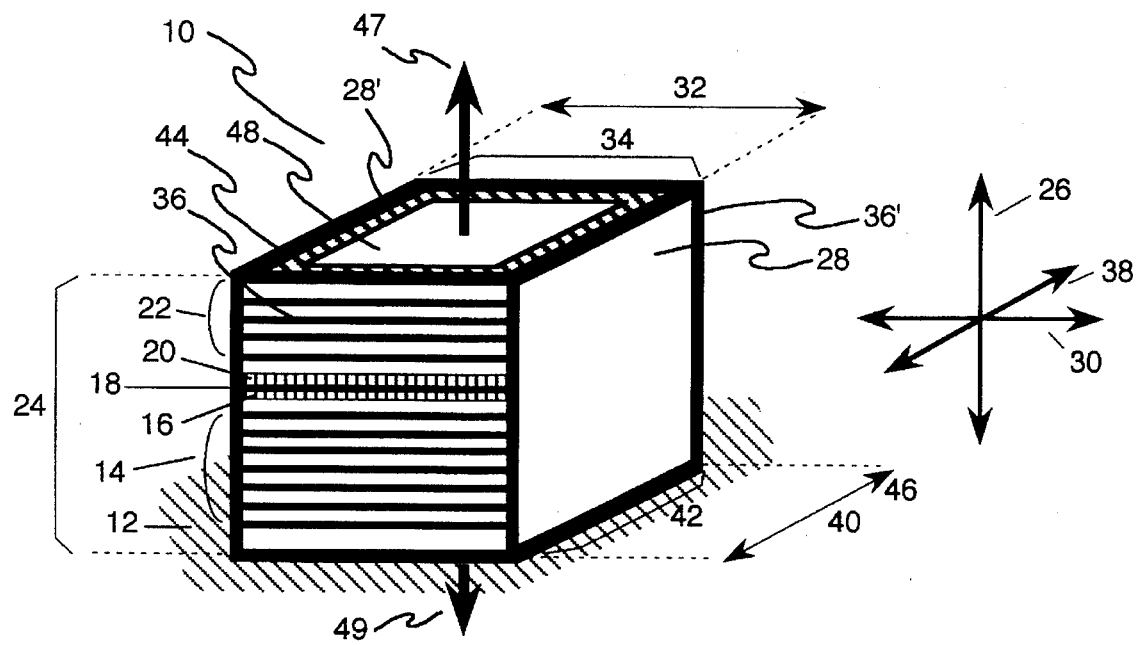
FIG. 1A is a three-dimensional view of a quantum cavity light emitter or QCLE illustrating its microstructure and its predetermined lateral and vertical dimensions according to a preferred embodiment of the invention.

With reference to the Figures, wherein like reference characters indicate like elements throughout the several views and, in particular, with reference to FIG. 1, a quantum cavity light emitter (QCLE) is illustrated in accordance with the present invention, FIG. 1A illustrates the structure of a preferred embodiment of a single QCLE 10. QCLE 10 resides upon substrate 12 and chiefly comprises first mirror 14, first cladding layer 16, light emitting material 18, second cladding layer 20 and second mirror 22 to form vertical cavity 24 in vertical dimension 26. In accordance with the present invention, vertical cavity 24 generally comprises a layered structure. Light emitting material 18, first and second cladding layers 16 and 20, and first and second mirrors 14 and 22 have thicknesses such that vertical cavity 24 enhances the emission of light from light emitting material 18 along first dimension 26. This enhancement is generally accomplished by the presence of an optical resonance of vertical cavity 24 within an optical wavelength range in which light emitting material 18 emits light. To a first order approximation, the effective cavity length of vertical cavity 24 should be an integral number of half-wavelengths of the light, with the wavelength corresponding to the peak emission wavelength of light emitting material 18.

Additionally, QCLE 10 is constructed with pairs of reflecting surfaces 28 and 28' separated along second dimension 30 by distance 32 forming horizontal cavity 34, and pairs of reflecting surfaces 36 and 36' separated along third dimension 38 by distance 40 forming horizontal cavity 42. Surfaces 28' and 36' are not directly visible in FIG. 1A since they are hidden behind other parts of QCLE 10. In accordance with the present invention, distances 32 and 40 are predetermined such that horizontal cavities 34 and 42 suppress emission of light from light emitting material 18 along second and third dimensions 30 and 38. This suppression is generally accomplished by the absence of optical resonances of horizontal cavities 34 and 42 within the optical wavelength range in which light emitting material 18 emits light. To a first order approximation, the effective cavity lengths of horizontal cavities 34 and 42 should be odd-integral numbers of quarter-wavelengths of the light, with the wavelength corresponding to the peak emission wavelength of light emitting material 18. A preferred method for forming reflecting surfaces 28, 28', 36 and 36' is by etching. The shape is preferably patterned by photolithographic or similar lithographic processes. It is possible and within the scope of the present invention that either first mirror 14 or second mirror 22 or both would have negligible reflectivity or even be absent from QCLE 10. The primary basis of the present invention is the presence of horizontal cavities, e.g., horizontal cavities 34 and 42, which have predetermined thicknesses such that they suppress emission of light from light emitting material 18 along second and third dimensions 30 and 38.

Preferably, first and second mirrors 14 and 22 are electrically conductive, allowing QCLE 10 to be electrically contacted on top contact 44. If substrate 12 is electrically conductive, it may serve as bottom contact 46 to QCLE 10. Alternatively, some or all of first and second mirrors 14 and 22 may be electrically insulating. In this case, top and bottom contacts 44 and 46 may be located within vertical cavity 24. For example, top contact 44 may reside between second cladding layer 20 and second mirror 22, or bottom contact 46 may reside between first cladding layer 16 and first mirror 14. It is possible to construct a plurality of QCLEs 10 with a common bottom contact 46 and individual top contacts 44. Preferably top contact 44 is transparent or semi-transparent, comprising for example, indium tin oxide or a very thin layer, typically 400 Å or less, of a metal such as gold or silver. For top emitting QCLEs, light beam 47 may pass through top contact 44. If top contact 44 is opaque and emission out the top of QCLE 10 is desired, it is possible for light to emit through optional window 48. Additionally, light beam 49 may emit downward. Whether transparent, semi-transparent or opaque, top contact 44 may reside on top of second mirror 22 as shown in FIG. 1A, within second mirror 22, or between second cladding layer 20 and second mirror 22. When top contact 44 resides within second mirror 22, or between second cladding layer 20 and second mirror 22, electrical conductivity is not necessary or desirable for the portion of second mirror 22 residing above top contact 44. In many cases, top contact 44 will induce some reflectivity, such as the case when top contact 44 comprises a metal. In these cases, top contact 44 may add to the reflectivity of second mirror 22.

Figure 1B:
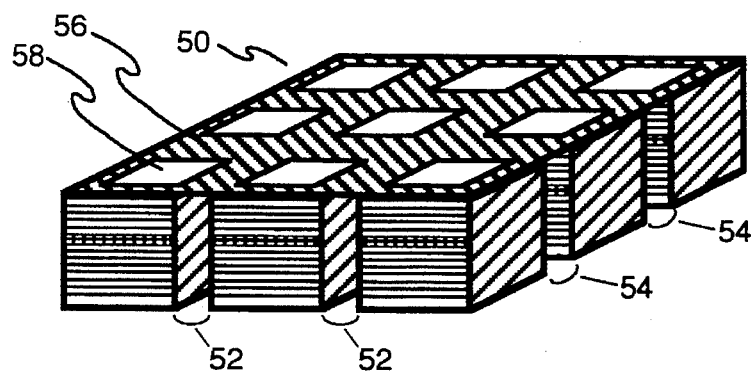
FIG. 1B is a three-dimensional view of a plurality of QCLEs illustrating their predetermined lateral dimensions and separations.

Referring now to FIG. 1B, there is shown a plurality of QCLEs 50, each of which is similar to QCLE 10 of FIG. 1A. QCLEs 50 are separated by distance 52 along second dimension 30, and by distance 54 along third dimension 38. Distances 52 and 54 may be predetermined to further suppress emission of light from light emitting material 18 along second and third dimensions 30 and 38. This further suppression is accomplished by increasing the reflectivities in second and third dimensions 30 and 38 to levels higher than those produced by single surfaces 28, 28', 36 or 36'. To a first order approximation, separations 52 and 54 should be odd-integral numbers of quarter-wavelengths of the light, with the wavelength corresponding to the peak emission wavelength of light emitting material 18. The plurality of QCLEs 50 form distributed bragg reflectors along second and third dimensions 30 and 38.

While it is possible for each element in plurality of QCLEs 50 to have its own electrical contact, for example like top contact 44 if QCLE 10 in FIG. 1A, it is also possible to have a common contact for plurality of QCLEs 50. FIG. 1B shows common top contact 56 contacting tops of all elements in the plurality of QCLEs 50. If top contact 56 is opaque and emission out the tops of the plurality of QCLEs 50 is desired, it is possible for light to emit through windows 58. It is possible and within the scope of the present invention to construct an plurality of QCLEs 50.

Figure 2A:
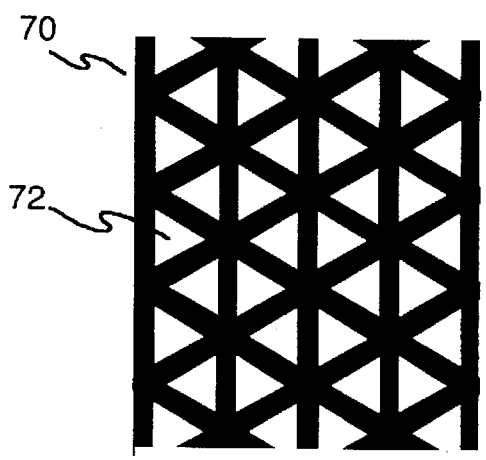
FIG. 2A is a top planar view of a plurality of separated QCLEs in which the shapes of the QCLEs are triangular.
Figure 2B:
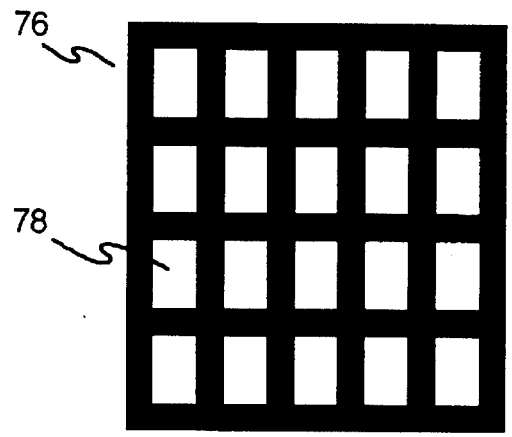
FIG. 2B is a top planar view of a plurality of separated QCLEs in which the shapes of the QCLEs are rectangular.
Figure 2C:
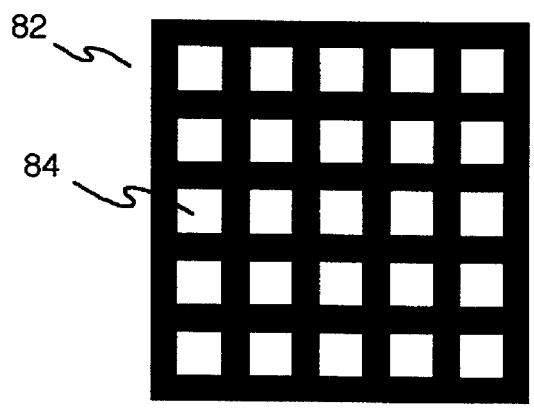
FIG. 2C is a top planar view of a plurality of separated QCLEs in which the shapes of the QCLEs are square.
Figure 2D:
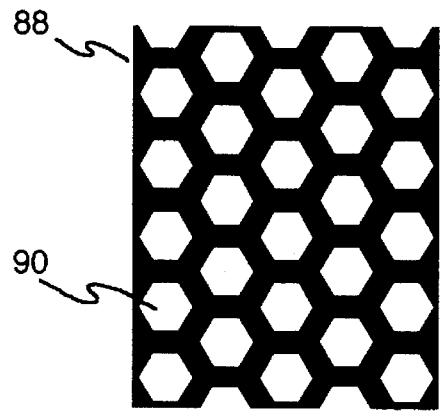
FIG. 2D is a top planar view of a plurality of separated QCLEs in which the shapes of the QCLEs are hexagonal.
Figure 2E:
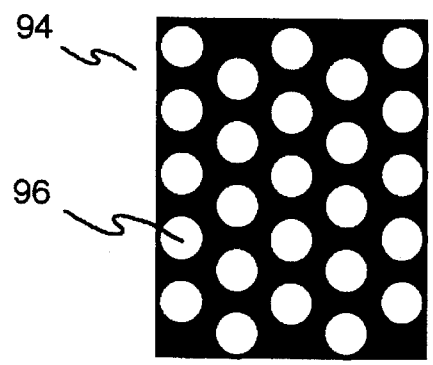
FIG. 2E is a top planar view of a plurality of separated QCLEs in which the shapes of the QCLEs are circular.
Figure 2F:
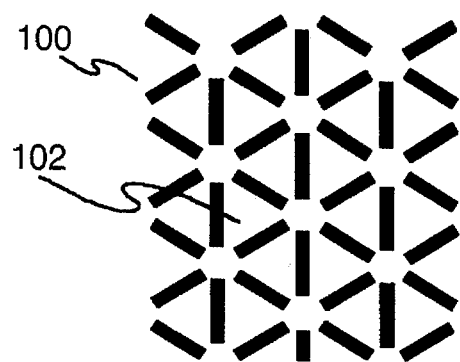
FIG. 2F is a top planar view of a plurality of connected QCLEs in which the shapes of the QCLEs are triangular.
Figure 2G:
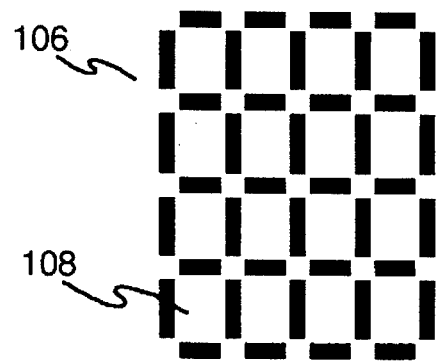
FIG. 2G is a top planar view of a plurality of connected QCLEs in which the shapes of the QCLEs are rectangular.
Figure 2H:
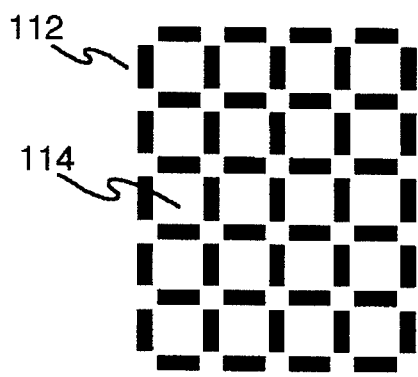
FIG. 2H is a top planar view of a plurality of connected QCLEs in which the shapes of the QCLEs are square.
Figure 2I:
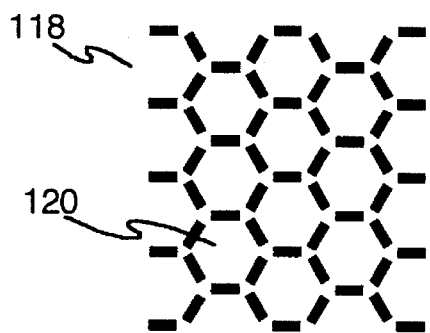
FIG. 2I is a top planar view of a plurality of connected QCLEs in which the shapes of the QCLEs are hexagonal.
Figure 2J:
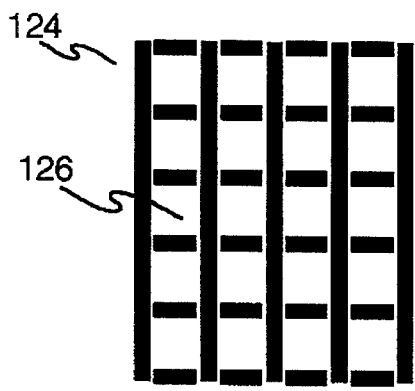
FIG. 2J is a top planar view of a plurality of connected QCLEs in which the shapes of the QCLEs are square.
Figure 2K:
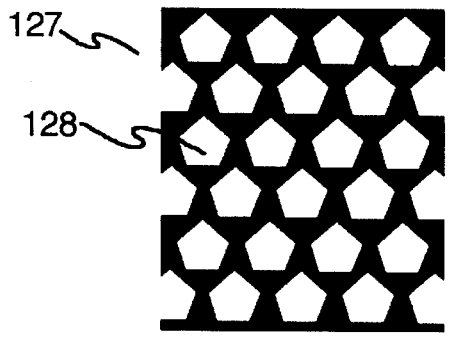
FIG. 2K is a top planar view of a plurality of separated QCLEs in which the shapes of the QCLEs are pentagonal.

Referring now to FIGS. 2A through 2K, there is shown a series of top planar views of different shapes and structures of individual and pluralities of QCLEs. Separated QCLEs are completely surrounded by surfaces oriented substantially parallel to the first dimension of FIG. 1A, which is perpendicular to the surface of the paper in FIGS. 2A through 2K. In FIGS. 2A through 2K, the white regions represent QCLEs, and the black regions represent areas between QCLEs which has, for example, been removed by etching or a similar process. FIG. 2A shows a portion of an array 70 comprising separated triangular QCLEs 72. FIG. 2B shows a portion of an array 76 comprising separated rectangular QCLEs 78. FIG. 2C shows a portion of an array 82 comprising separated square QCLEs 84. FIG. 2D shows a portion of an array 88 comprising separated hexagonal QCLEs 90. FIG. 2E shows a portion of an array 94 comprising separated circular QCLEs 96. FIG. 2F shows a portion of an array 100 comprising connected triangular QCLEs 102. FIG. 2G shows a portion of an array 106 comprising connected rectangular QCLEs 108. FIG. 2H shows a portion of an array 112 comprising connected triangular QCLEs 114. FIG. 2I shows a portion of an array 100 comprising connected hexagonal QCLEs 102. FIG. 2J shows a portion of an array 124 comprising connected triangular QCLEs 126. FIG. 2K shows a portion of an array 127 comprising separated pentagonal QCLEs 128. It is to be appreciated that QCLEs of the present invention may take any shape. The shapes illustrated in FIG. 2 are merely exemplary and chosen due to their inherent regular structures which may make them more amenable to fabrication. Furthermore, it is not necessary for the reflecting surfaces, for example reflecting surfaces 28, 28', 36 and 36' to be planar; such reflecting surfaces may take any shape, for example, curved.

Preferably, the QCLEs in the various arrays illustrated in FIGS. 2A through 2K have optical sizes and are optimally separated as discussed in the descriptions of FIGS. 1A and 1B. Although the QCLEs and arrays illustrated in FIG. 1B and FIGS. 2A through 2K have been described as comprising horizontal optical cavities having predetermined sizes and separations, the aforementioned design features are the same as those which are used to describe two-dimensional photonic bandgap structures. The arrays illustrated in FIG. 1B and FIGS. 2A through 2K are, therefore, exemplary of two-dimensional photonic bandgap structures. Significantly, the two-dimensional photonic bandgap structures described in the present invention typically have minimum feature sizes greater than ⅛ the vacuum optical wavelength or lattice constants greater than one optical wavelength in the composite medium. The term "vacuum optical wavelength" refers to the peak emission wavelength of the light emitted from the light emitting material as measured in vacuum. The term "composite medium" refers to the combination of materials in the photonic bandgap, for example, semiconductor and air. The refractive index of the composite medium is defined to be equal to the weighted average of the refractive indices of its constituent elements. The wavelength in the composite medium is the vacuum optical wavelength divided by the refractive index of the composite medium as defined herein. The two-dimensional bandgap structures described by Wendt et al. have lattice constants about equal to one-half an optical wavelength in the composite medium because that corresponds to a standard distributed bragg reflector design. The present invention demonstrates that a two-dimensional photonic bandgap structure may have a significantly larger lattice constant and still effectively enhance the efficiency of a light emitting element. Although exemplary light emitters having a two-dimensional photonic bandgap structures are illustrated in FIG. 1B and FIGS. 2A through 2K, any other two-dimensional photonic bandgap structures having minimum feature sizes greater than ⅛ the vacuum optical wavelength or lattice constants greater than one optical wavelength in the composite medium are within the scope of the present invention.

Referring now to FIG. 3 which shows top cross-sectional views of QCLEs, there are shown two classes of horizontal modes: 1) standing wave modes in which waves counter-propagate, generally between two parallel surfaces; and 2) traveling wave modes in which waves circulate about the QCLE. Standing wave modes behave much the same as the modes in a vertical cavity, only they are oriented horizontally. Traveling wave modes are the modes utilized in whisper-gallery cavities.

Figure 3A:
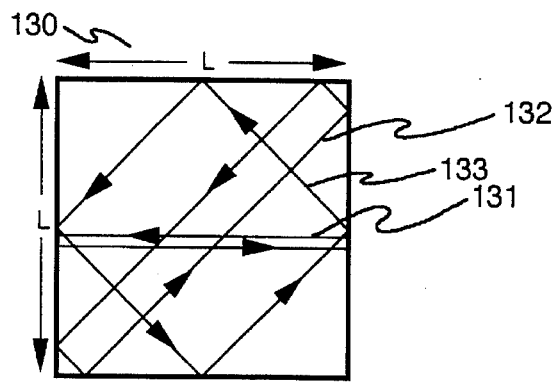
FIG. 3A is a top view illustrating standing wave modes and traveling wave modes in a square QCLE.

FIG. 3A shows a top cross-sectional view of square QCLE 130 with lateral dimensions L, which exhibits standing wave mode 131 and traveling wave modes 132 and 133. Of interest here is the round trip path length of the modes. For standing wave mode 131, the round trip path length is 2 L. For both traveling wave modes 132 and 133, the round trip path length is about 2.8 L or, more accurately, 2 L times the square root of 2. Although only one standing wave mode 131 is illustrated, standing wave modes cover the entire area of square QCLE 130, counter-propagating along both second and third dimensions, such dimensions defined in FIG. 1A. The standing wave modes have a round trip path length of 2 L. Similarly, traveling wave modes similar to traveling wave modes 132 and 133 cover the entire area of QCLE 130, and have the same round trip path length of 2 L times the square root of 2.

Figure 3B:
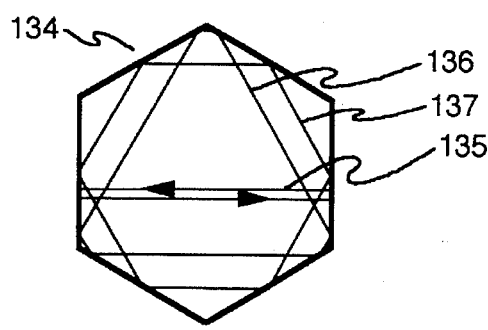
FIG. 3B is a top view illustrating standing wave modes and traveling wave modes in a hexagonal QCLE.

FIG. 3B shows a top cross-sectional view of hexagonal QCLE 134 standing wave mode 134 and traveling wave modes 136 and 137. For convenient comparison with square QCLE 130 of FIG. 3A, the distance between opposite faces of hexagonal QCLE 134 is chosen to be L. For standing wave mode 135, the round trip path length is 2 L. For both traveling wave modes 136 and 137, the round trip path length is 3 L. Although there are many more modes than are shown in FIG. 3B, the standing wave modes have round trip path lengths of 2 L and the traveling wave modes have round trip path lengths of 3 L.

Figure 3C:
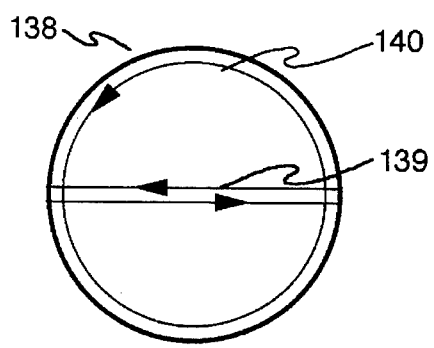
FIG. 3C is a top view illustrating standing wave modes and traveling wave modes in a circular QCLE.

FIG. 3C shows a top cross-sectional view of circular QCLE 138, standing wave mode 139 and traveling wave mode 140. For convenient comparison with square QCLE 130 of FIG. 3A, the distance between opposite faces of circular QCLE 138 is chosen to be L. For standing wave mode 139, the round trip path length is 2 L. For traveling wave mode 140, the round trip path length is πL. Although there are many more standing wave modes than are shown in FIG. 3C, the standing wave modes have round trip path lengths of 2 L. FIG. 3C illustrates that standing wave modes may reflect from nonplanar reflecting surfaces.

Figure 3D:
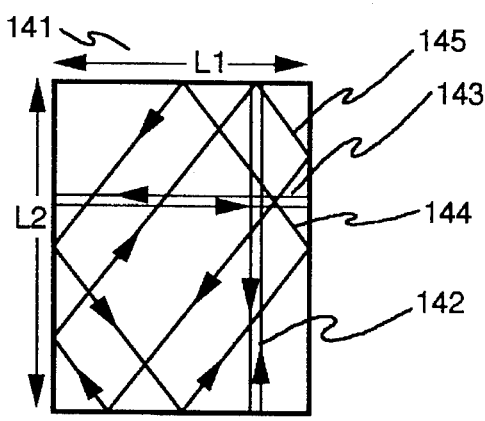
FIG. 3D is a top view illustrating standing wave modes and traveling wave modes in a rectangular QCLE.

FIG. 3D shows a top cross-section view of rectangular QCLE 141 with lateral dimensions L1 and L2, which exhibits standing wave modes 142 and 143 and traveling wave modes 144 and 145. For standing wave mode 142, the round trip path length is two times L2. For standing wave mode 143, the round trip path length is two times L1. For both traveling wave modes 144 and 145, the round trip path length is two times the square root of the sum of the squares of L1 and L2. Standing wave modes cover the entire area of rectangular QCLE 141, counter-propagating along both second and third dimensions, such dimensions defined in FIG. 1A. The standing wave modes have a round trip path length of two times L1 or two times L2. Similarly, traveling wave modes similar to traveling wave modes 144 and 145 cover the entire area of rectangular QCLE 141 and have the same round trip path length of two times the square root of the sum of the squares of L1 and L2.

Figure 3E:
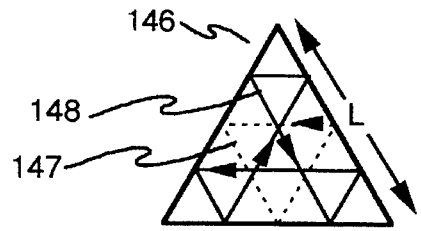
FIG. 3E is a top view illustrating traveling wave modes in a triangular QCLE.

FIG. 3E shows a top cross-sectional view of triangular QCLE 146 with lateral dimensions L, which exhibits traveling wave modes 147 and 148. Triangular QCLE 146 exhibits no standing wave modes of the kind illustrated in FIGS. 3A, 3B, 3C and 3D. For traveling wave mode 147, the round trip path length is 1.5 L. For traveling wave mode 148, the round trip path length is 3 L. Traveling wave modes similar to traveling wave mode 148 cover the entire area of triangular QCLE 146 and have the same round trip path length of 3.

The round trip path lengths for the various modes illustrated in FIGS. 3A, 3B, 3C, 3D and 3E and specified in the descriptions thereof represent approximations based on geometrical optics. It should be understood that an accurate determination of path lengths requires a number of corrections, such as those accounting for the wave nature of the light, angle dependent phase change on reflection, or for waveguide dispersion, etc. These corrections, while changing the actual values of the path lengths, do not substantially affect the general behavior of the modes and the strategies for designing efficient QCLEs, other than making corrections in the overall dimensions of the QCLEs. It should be understood that traveling waves may propagate equally well in either direction, i.e., clockwise or counter-clockwise from the top. In general, polygonal QCLEs having no parallel sides and no perpendicular sides will not exhibit standing waves of the kind illustrated in FIGS. 3A, 3B, 3C and 3D.

Since the traveling wave modes illustrated in FIGS. 3A, 3B, 3C, 3D and 3E have light beams which may experience total internal reflection, these modes may have very low losses and therefore may produce very sharp resonances. In contrast, the standing wave modes experience only modest reflections, unless enhanced by adjacent devices or by metallic reflectors. Thus, the standing wave resonances are generally relatively broad.

Figure 4:
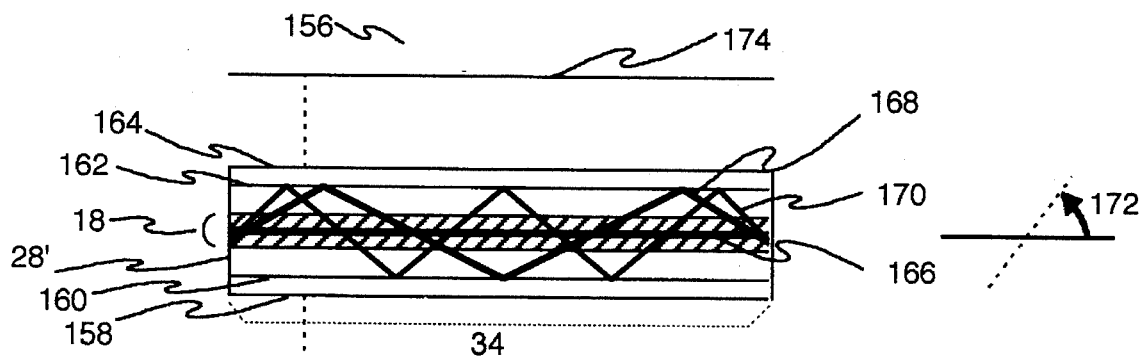
FIG. 4 is a cross-sectional side view illustrating lowest-order and higher-order lateral modes.

Referring now to FIG. 4, there is shown a horizontal cross-sectional view of the region of QCLE 156 which immediately surrounds light emitting material 18. Reflecting interfaces 158 and 160 represent a portion of first mirror 14 of FIG. 1A, while reflecting interfaces 162 and 164 represent a portion of second mirror 22 of FIG. 1A. Reflecting surfaces 28 and 28' form horizontal cavity 34. Schematically shown in FIG. 4 are the light propagation paths for lowest-order lateral mode 166 and for higher-order lateral modes 168 and 170. Higher-order modes propagate in directions having larger angles 172 with respect to the plane of QCLE 156. It is well known in the art that higher-order lateral modes generally have resonances at shorter wavelengths than lower-order lateral modes. Higher-order lateral mode 170 propagates at a steep angle 172, illustrating that the distinction may not be clear between axial modes and lateral modes. It is well known in the art that optical beams propagating inside a material having a refractive index may experience "total internal reflection" upon encountering a surface behind which there is a material having a lower refractive index. For typical device parameters relevant to the present invention, light propagating at angles less than about 73 degrees will experience total internal reflection from exit surface 174 and therefore will not exit the device. Therefore, for the purposes of discussion of the present invention, modes which are at sufficiently small angles 172 to experience total internal reflection from exit surface 174 are considered lateral modes. Modes which are not totally internally reflected from exit surface 174 are considered axial modes.

Figure 5:
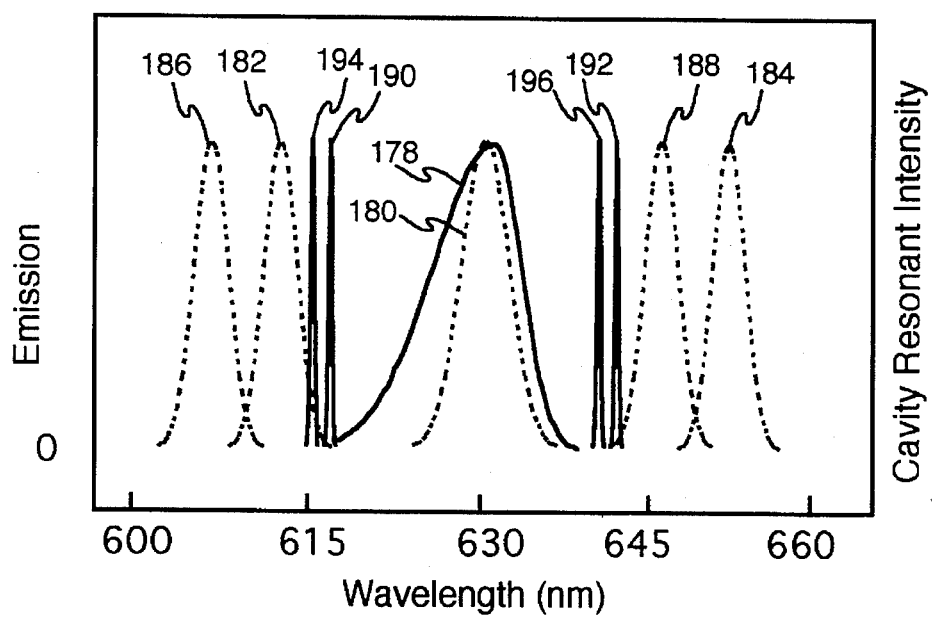
FIG. 5 illustrates the emission spectrum of the light emitting material and vertical and horizontal cavity resonances for lowest-order and higher-order modes for both standing waves and traveling waves.

Referring now to FIG. 5, there are shown spectra for the light emission from light emitting material 18 and for some resonances resulting from vertical and horizontal cavities in an appropriately designed QCLE. In the description of FIG. 5, number references are taken from FIGS. 1A and 4 in order to correlate the resonances with device structures. Emission spectrum 178 represents a typical intrinsic (no cavity) emission spectrum from a preferred light emitting material: quantum wells formed from InGaAlP. Vertical cavity resonance 180 resulting from vertical cavity 24 overlaps well with emission spectrum 178, thus emission from light emitting material 18 is enhanced in the vertical direction (first dimension). Since vertical cavity 24 is typically very short, longitudinal modes are widely separated in wavelength and other longitudinal modes are well out of the spectral region illustrated. Lowest-order horizontal resonances 182 and 184 result from horizontal cavity 34 and represent consecutive longitudinal modes for the lowest-order horizontal mode 166 of horizontal cavity 34. At the wavelengths shown in FIG. 5 and for typical material parameters, the difference in wavelength shown for modes 182 and 184 (about 40 nm) corresponds to a distance 32 of approximately 1.5 micrometers, which corresponds to the length of horizontal cavity 34. This length is about 8 optical wavelengths in the material. Higher-order horizontal resonances 186 and 188 also result from horizontal cavity 34 and represent consecutive longitudinal modes for higher-order mode 168 of horizontal cavity 34. Higher-order horizontal resonances 186 and 188 are seen to be shifted to shorter wavelengths compared to lowest-order horizontal resonances 182 and 184.

In FIG. 5, there are also shown traveling-wave horizontal resonances 190 and 192 resulting from the traveling wave propagation paths such as those illustrated in FIGS. 3A, 3B and 3C. Due to the total internal reflection, the resonances are very sharp, providing large enhancement of light emission over a very narrow wavelength range. Since the round trip path length for the traveling wave resonances is longer than the round trip path length for the standing wave resonances, the wavelength separation between consecutive longitudinal modes is smaller for the traveling wave resonances. The traveling wave resonances may also include higher order resonances 194 and 196, analogous to higher order horizontal resonances 186 and 188.

From the description of FIG. 5 and discussion thereof, some elements of the inventive process for designing an efficient QCLE is revealed. The key is the elimination of any overlap between emission spectrum 178 and the various resonances resulting from all forms of horizontal (lateral) modes. Making the horizontal dimensions of the QCLE smaller will widen the separations between the lateral modes and therefore make the design more tolerant to fabrication errors. However, in contrast to previously published discussions of microcavities, it is not necessary to reduce the horizontal dimensions to one or two wavelengths in order to eliminate lateral emission. Furthermore, while previous publications show monotonic improvement in modal performance with decreasing horizontal dimensions, the present invention shows that this is not the case. Referring again to FIG. 5, it is seen that if the horizontal dimension were to be reduced slightly, thereby shifting all the resonances to shorter wavelengths, then any or all of resonances 184, 188, 192 or 196 might overlap with emission spectrum 178, thereby degrading the efficiency as compared to the design characterized in FIG. 5. Considering the fact that higher order lateral resonances are shifted to shorter wavelengths, the first order approximation of making the horizontal dimensions equal to an odd number of quarter wavelengths may not be optimal. The optimal width may be somewhat larger than an odd number of quarter wavelengths in order to prevent the shorter wavelength resonances from overlapping with the emission spectrum. It is likely that the optimal width is greater than (N−0.1) quarter wavelengths and less than (N+0.9) quarter wavelengths, where N is an odd numbered integer and the wavelength referred to is the peak emission wavelength of the light emitting material. The separation between adjacent elements in a plurality of QCLE should be similarly modified, e.g., greater than (N−0.1) quarter wavelengths and less than (N+0.9) quarter wavelengths.

From the discussion of the preceding paragraph, it is seen that accurate predetermination of QCLE dimensions may be a complex process. When treating microcavities, including QCLEs, many approximations, which are valid for macroscopic structures, are no longer valid, making accurate modeling difficult and time consuming. Furthermore, real fabrication process may not produce structures of the precise shapes, e.g., squares, generally used in modeling. Thus, it is possible that additional corrections to the designs may be made by experimental determination. It is within the scope of the present invention that some or all of the predetermination of the QCLE dimensions is performed through experimentation. Such experimentation may furthermore include the fabrication process.

Figure 6:
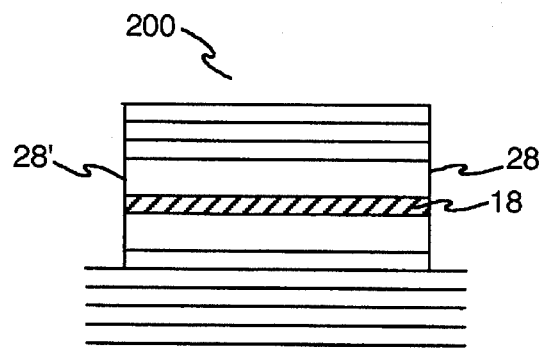
FIG. 6 is a cross-sectional side view illustrating the vertical extent of the lateral reflecting surfaces.

Referring now to FIG. 6, there is shown a cross-sectional side view of QCLE 200 in which reflecting surfaces 28 and 28' occur only over a portion of the vertical extent of QCLE 200. Since reflecting surfaces 28 and 28' are positioned to form horizontal cavities containing light emitting material 18, it is not necessary in the present invention for reflecting surfaces 28 and 28' to extend vertically much above or below light emitting material 18. In a preferred embodiment, an etching process forms reflecting surfaces 28 and 28' and stops shortly after etching through light emitting material 18. It is also possible and within the present invention to stop the etching process just above light emitting material 18, although the effect of reflecting surfaces 28 and 28' may be reduced.

Referring now to FIG. 7, there is shown QCLE 204 which further comprises electrically insulating regions 206, which confine any electrical current to flow mainly through central portion 208 of QCLE 204. Such electrically insulating regions may be produced, for example, by processes such as ion implantation or by oxidation of one or more high-aluminum-content AlGaAs layers. Although the present invention primarily focuses on QCLEs comprising layered structures, electrically insulating regions 206, or similarly oriented regions, do not detract from the basic premises of the invention. Electrically insulating regions 206 may extend throughout the entire vertical extent of QCLE 204, or through any subset of QCLE 204.

Referring now to FIG. 8, there is shown QCLE 212 which further comprises passivation regions 214. The main function of passivation regions 214 is to reduce nonradiative recombination of injected electrons and holes in the regions of reflecting surfaces 28 and 28'. In semiconductor nomenclature, nonradiative recombination is the recombination of electrons and holes in which optical radiation is not emitted. The same nomenclature is appropriate for organic material based light emitting diodes and lasers. Since nonradiative recombination represents a power loss mechanism in diode lasers and LEDs, it is desirable to minimize its effects either through choice of materials or by employing passivation processes. GaAs and AlGaAs have large surface recombination, which is a form of nonradiative recombination, and have been passivated by treating the surfaces with either hydrogen plasma or with sulfur containing solutions. Preferably, passivation regions 214 prevent electrons and holes from entering passivation regions 214. This may be accomplished, for example, in GaAs or InGaP quantum wells by diffusing material, for example aluminum or phosphorus, into the quantum wells in the periphery of the device. Since the incorporation of materials such as aluminum or phosphorus into GaAs or InGaP quantum wells raises their bandgap potential, electrons and holes are repelled from these regions.

Referring now to FIG. 9, there are shown some alternatives for materials residing directly outside reflecting surfaces 28 and 28'. FIG. 9A shows QCLE 218 with dielectric material 220 residing directly outside reflecting surfaces 28 and 28'. Advantages of dielectric materials are that they do not absorb the light and they do not affect the electrical current flow. Dielectric material 220 may comprise, for example, air, or it may comprise a material which has filled in the empty regions. Example materials and processes suitable for filling are polyimide by spinning and planarization, and silicon dioxide, silicon monoxide or silicon nitride by evaporation. FIG. 9B shows QCLE 224 with metal 226 residing outside reflecting surfaces 28 and 28'. Advantages of metal 226 outside reflecting surfaces 28 and 28' are that the metal greatly increases the reflectivity, from typically 30% to greater than 90%. The increased reflectivity increases the resonance effects of standing wave horizontal cavity 34, thereby further suppressing horizontal radiation of light from light emitting material 18. Metal 226 may also enhance the removal of heat generated in QCLE 224 via thermal conduction. Since metal 226 generally conducts electrical current, it may be desirable to use insulation layer 228 to insulate metal 226 from reflecting surfaces 28 and 28'. Insulating layer 228 may be deposited, for example, by sputtering or evaporation. Alternatively, insulating layer 228 may be created by treating reflecting surfaces 28 and 28', for example, by a implantation process, a damage process or an oxidation process. The presence of metal 226 and insulation layer 228 will substantially affect the effective round trip path length of horizontal cavity 34, depending upon the material and thickness of insulating layer 228 and upon the material and thickness of metal layer 226. Thus, the predetermination of the length of horizontal cavity 34 depends on the nature of metal 226 and insulating layer 228.

Referring now to FIG. 10, there is shown a top planar view of activated QCLE element 232 which is activated through electrical contact 234. Surrounding activated QCLE element are nonactivated elements 236. The configuration illustrated may be preferred, for example, when an extremely low power devices is desirable and when dielectric material resides outside reflecting surfaces 28 and 28'. The function of nonactivated elements 236, in this case, is to enhance the reflectivity of reflecting surfaces 28 and 28'. Nonactivated elements 236 may have similar dimensions as activated QCLE element 232, as shown in FIG. 10A, or they may have different dimensions. FIG. 10B shows activated QCLE element 240 surrounded by nonactivated elements 242. Preferably, nonactivated elements 242 as shown in FIG. 10B have the structure of distributed Bragg reflectors.

Figure 11:
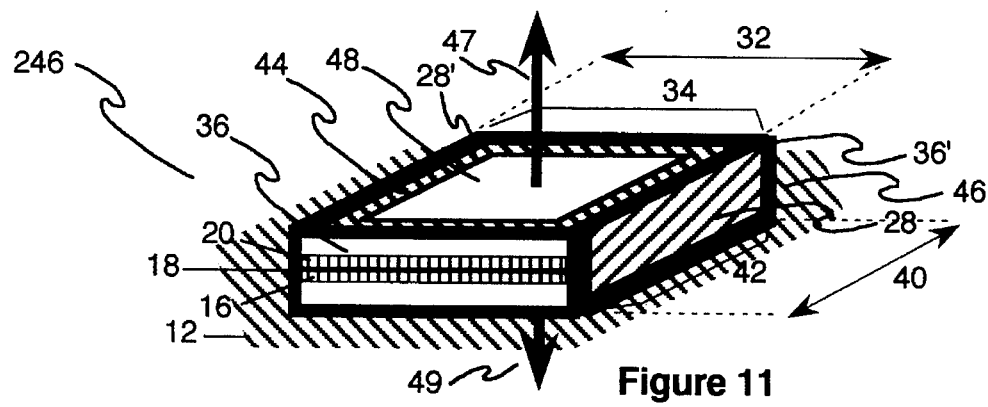
FIG. 11 is a top planar view of a QCLE comprising two horizontal cavities with no vertical cavity.

Referring now to FIG. 11, there is shown QCLE 246, which is similar to QCLE 10 except for the absence of first and second mirrors 14 and 22. The descriptions of the parts identified in FIG. 11 are identical to the same-numbered parts in FIG. 1A.

Methods for producing QCLEs generally comprise the steps of producing at least one light emitting material, forming a first (vertical) optical cavity along a first dimension which contains the light emitting material, the first optical cavity produced to enhance emission of light along the first dimension, designing at least a second (horizontal) optical cavity along a second dimension substantially perpendicular to said first dimension to suppress emission of light along the second dimension, the second optical cavity also containing the light emitting material, and forming the second optical cavity. The order of these steps is not necessarily in the stated sequence. For example, it may be desirable to form horizontal cavities before depositing the second mirror which completes the vertical optical cavity. In general, a plurality of QCLEs will be produced simultaneously. Defining horizontal cavities is generally accomplished by a lithographic process, although the final dimensions of the QCLEs may differ somewhat from the lithographically defined patterns. The lithographic process would generally comprise a process selected from the group: conventional optical, holographic, phase shift, spatial frequency doubling, electron beam, x-ray proximity, and extreme ultra-violet imaging.

It is to be appreciated and understood that the specific embodiments of the invention are merely illustrative of the general principles of the invention. Various modifications may be made upon the preferred embodiments described consistent with the principles set forth. Although the generic term of light emitter is generally used, the QCLEs may take on the form or function of any light emitter including, for example, light emitting diodes, lasers, or vertical-cavity surface-emitting lasers. While several exemplary materials for light emitting material 18 have been stated, a larger group of light emitting materials includes, without limitation, (In,Al,Ga)N, Zn(Se,S), (In,Al,Ga)(As,P), Ga(As,P), (In,Al,Ga)P, (In,Al,Ga)As, (In,Ga)(As,P), and light emitting organic materials. Suppression of light emission in a direction does not imply complete and absolute suppression, rather it implies a substantial reduction of emission, for example, to less than 50% of the emission rate that occur in the absence of any cavity. When references are made to "wavelength" in terms of specifying dimensions, it is to be understood that the wavelength represents the wavelength in the appropriate optical medium, in other words the vacuum wavelength divided by the refractive index of the optical medium. The scope of the invention is indicated by the appended claims rather than by the foregoing description.

What is claimed is:

1. A light emitting element comprising:

at least one light emitting material, said light emitting material emitting light in a wavelength range centered about a center wavelength;

first and second reflecting mirrors at opposite sides of said light emitting material forming a first optical cavity in a first dimension which includes said light emitting material and reflecting mirrors and which enhances emission of light substantially parallel to said first dimension at a wavelength within said wavelength range, at least one of said mirrors being at least partially transparent to light in said wavelength range to allow said light emitted from said light emitting material to be emitted therethrough; and at least two reflective surfaces oriented substantially perpendicular to said first dimension, said at least two reflective surfaces forming a second optical cavity in a second dimension substantially perpendicular to said first dimension, said second optical cavity being of a predetermined size such that it suppresses emission of light substantially parallel to said second dimension from said light emitting material.

2. The light emitting element recited in claim 1 wherein said at least two reflective surfaces form a shape which is substantially triangular.

3. The light emitting element recited in claim 1 wherein said at least two reflective surfaces form a shape which is substantially rectangular.

4. The light emitting element recited in claim 1 wherein said at least two reflective surfaces form a shape which is substantially square.

5. The light emitting element recited in claim 1 wherein said at least two reflective surfaces form a shape which is substantially hexagonal.

6. The light emitting element recited in claim 1 wherein said at least two reflective surfaces form a shape which is substantially circular.

7. The light emitting element recited in claim 1 wherein said light emitting material in the vicinity of said at least two reflective surfaces has been treated to reduce nonradiative recombination.

8. The light emitting element recited in claim 1 further comprising means for injecting electrical current into said light emitting material.

9. The light emitting element recited in claim 8 further comprising current confining means which confine said electrical current to central portion of said light emitting material.

10. The light emitting element recited in claim 1 wherein said at least two reflective surfaces are formed by etching.

11. The light emitting element recited in claim 1 wherein said at least two reflective surfaces extend through at most one of said first and second mirrors.

12. The light emitting element recited in claim 1 wherein said at least two reflective surfaces are bounded by a dielectric material.

13. The light emitting element recited in claim 12 wherein said dielectric material is substantially air.

14. The light emitting element recited in claim 12 wherein said dielectric material has been deposited and substantially comprises a material from the group of: polyimide, silicon dioxide, silicon monoxide, silicon nitride.

15. The light emitting element recited in claim 1 wherein said at least two reflective surfaces are bounded by a metallic material.

16. The light emitting element recited in claim 15 wherein said at least two reflective surfaces are insulated from said metallic material.

17. The light emitting element recited in claim 1 wherein said at least two reflective surfaces completely enclose said light emitting element in said second and third dimensions.

18. The light emitting element recited in claim 1 wherein said at least two reflective surfaces do not completely enclose said light emitting element in said second and third dimensions.

19. The light emitting element recited in claim 1 wherein said second optical cavity has resonances in a lowest order mode at a first wavelength and in at least one higher order mode at a second wavelength, said second wavelength being shorter than said first wavelength, said predetermined size of said second optical cavity being such that it suppresses emission of light substantially parallel to said second dimension at both of said first and second wavelengths.

20. The light emitting element recited in claim 1 wherein at least two of said at least two reflective surfaces are substantially parallel and separated by approximately an odd number of quarter wavelengths said quarter wavelengths being measured at said center wavelength.

21. The light emitting element recited in claim 19 wherein at least two of said at least two reflective surfaces are substantially parallel and separated by greater than (N−0.1) quarter wavelengths and by less than (N+0.9) quarter wavelengths where N is an odd numbered integer, said quarter wavelengths being measured at said center wavelength.

22. The light emitting element recited in claim 1 wherein said second optical cavity has standing wave modes, said second optical cavity being of a predetermined size such that it suppresses emission of light in said standing wave modes at a wavelength within said wavelength range.

23. The light emitting element recited in claim 1 wherein said second optical cavity has traveling wave modes, said second optical cavity being of a predetermined size such that it suppresses emission of light in said traveling wave modes at a wavelength within said wavelength range.

24. The light emitting element recited in claim 1 wherein said second optical cavity has standing wave modes, said second optical cavity being of a predetermined size such that it suppresses emission of light in said standing wave modes at a wavelength within said wavelength range, and in which said second optical cavity additionally has traveling wave modes, said second optical cavity being of a predetermined size such that it suppresses emission of light in said traveling wave modes at a wavelength within said wavelength range.

25. The light emitting element recited in claim 1 comprising a plurality of said light emitting elements.

26. The light emitting element recited in claim 25 wherein said at least two reflective surfaces completely enclose said light emitting element in said second and third dimensions.

27. The light emitting element recited in claim 25 wherein said at least two reflective surfaces do not completely enclose said light emitting element in said second and third dimensions.

28. The light emitting element recited in claim 25 wherein at least two reflective surfaces on adjacent light emitting elements are separated by a distance such that they further suppress emission of light substantially parallel to said second dimension at a wavelength within said wavelength range.

29. The light emitting element recited in claim 25 wherein at least two reflective surfaces on adjacent light emitting elements are separated by a distance such that the reflectivities of said at least two reflecting surfaces is increased.

30. The light emitting element recited in claim 25 wherein at least two reflective surfaces on adjacent light emitting elements are separated by approximately an odd number of quarter wavelengths, said quarter wavelengths being measured at said center wavelength.

31. The light emitting element recited in claim 25 wherein at least two reflective surfaces on adjacent light emitting elements are separated by greater than (N−0.1) quarter wavelengths and by less than (N+0.9) quarter wavelengths where N is an odd numbered integer, said quarter wavelengths being measured at said center wavelength.

32. The light emitting element recited in claim 25 wherein at least one light emitting element is activated to emit light and at least one light emitting element is not activated to emit light.

33. The light emitting element recited in claim 1 wherein said light emitting material comprises a semiconductor.

34. The light emitting element recited in claim 33 wherein said semiconductor comprises a compound semiconductor from the group including: (In,Al,Ga)N, Zn(Se,S), (In,Al, Ga)(As,P), Ga(As,P), (In,Al,Ga)P, (In,Al,Ga)As, (In, Ga)(As,P).

35. The light emitting element recited in claim 1 wherein said light emitting material comprises a an organic material.

36. The light emitting element recited in claim 1 wherein said light emitting element comprises a light emitting diode.

37. The light emitting element recited in claim 1 wherein said light emitting element comprises a laser.

38. The light emitting element recited in claim 37 wherein said light emitting element comprises a vertical cavity surface emitting laser.

39. The light emitting element recited in claim 1 in which at least one of said first and second reflecting mirrors has no substantial reflectance at a wavelength within said wavelength range.

40. The light emitting element recited in claim 1 further comprising at least a third optical cavity oriented substantially perpendicular to said first dimension, said third optical cavity being of a predetermined size such that it suppresses emission of light substantially parallel to said first dimension at a wavelength within said wavelength range.

41. The light emitting element recited in claim 1 in which said second optical cavity has a length greater than two optical wavelengths, said wavelengths being measured at said center wavelength.

42. The light emitting element recited in claim 1, further characterized by an exit surface and further comprising lateral modes, said lateral modes being totally internally reflected at or before said exit surface, said second optical cavity being of a predetermined size such that it suppresses emission of light from said light emitting material into said lateral modes.

43. A light emitting element comprising:
   at least one light emitting material, said light emitting material emitting light in a wavelength range centered about a center wavelength;
   first and second reflecting mirrors at opposite sides of said light emitting material forming a first optical cavity in a first dimension which includes said light emitting material and reflecting mirrors and which has a resonance near said wavelength range, at least one of said mirrors being at least partially transparent in said wavelength range to allow light emitted from said light emitting material to be transmitted therethrough;
   at least two reflective surfaces oriented substantially perpendicular to said first dimension, said at least two reflective surfaces forming a second optical cavity, said second optical cavity being of a predetermined size such that it substantially has no resonances within said wavelength range.

44. A light emitting element comprising:
   a plurality of layers stacked along a first dimension and being substantially homogeneous in second and third dimensions perpendicular to said first dimension, said layers comprising at least one light emitting layer, said light emitting layer emitting light in a wavelength range centered about a center wavelength and first and second reflecting mirrors at opposite sides of said light emitting layer forming a first optical cavity in said first dimension which includes said light emitting layer and reflecting mirrors and which has a resonance near said wavelength range, at least one of said mirrors being at least partially transparent in said wavelength range to allow light emitted from said light emitting layer to be transmitted therethrough;
   at least two reflective surfaces oriented substantially perpendicular to said first dimension, said at least two reflective surfaces forming a second optical cavity, said second optical cavity being of a predetermined size such that it substantially has no resonances within said wavelength range.

45. A light emitting element comprising:

at least one light emitting material, said light emitting material emitting light in a wavelength range centered about a center wavelength;

first and second reflecting mirrors at opposite sides of said light emitting material forming a first optical cavity in a first dimension which includes said light emitting material and reflecting mirrors and which enhances emission of light substantially parallel to said first dimension at a wavelength within said wavelength range, at least one of said mirrors being at least partially transparent to light in said wavelength range to allow said light emitted from said light emitting material to be emitted therethrough; and at least two reflective surfaces oriented substantially perpendicular to said first dimension, said at least two reflective surfaces forming a second optical cavity in a second dimension substantially perpendicular to said first dimension, said second optical cavity being of a predetermined size such that it suppresses emission of light substantially parallel to said second dimension at a wavelength within said wavelength range.

\* \* \* \* \*